United States Patent
Choi et al.

(10) Patent No.: US 8,647,490 B2
(45) Date of Patent: Feb. 11, 2014

(54) METHOD FOR MANUFACTURING CARBON NANOTUBE CONTAINING CONDUCTIVE MICRO WIRE AND SENSOR INCLUDING THE MICRO WIRE

(75) Inventors: WooSeok Choi, Pohang (KR); Guenbae Lim, Pohang (KR); Tae-Chang An, Pohang (KR)

(73) Assignee: Postech Academy-Industry Foundation, Pohang (KR)

( * ) Notice: Subject to any disclaimer, the term of this patent is extended or adjusted under 35 U.S.C. 154(b) by 954 days.

(21) Appl. No.: 12/251,609

(22) Filed: Oct. 15, 2008

(65) Prior Publication Data

US 2009/0114541 A1    May 7, 2009

(30) Foreign Application Priority Data

Oct. 31, 2007    (KR) .................. 10-2007-0110157

(51) Int. Cl.
    *C25D 1/04*      (2006.01)
    *G01N 27/04*      (2006.01)

(52) U.S. Cl.
    USPC ............. 205/76; 205/341; 205/342; 205/413; 205/414; 205/419; 422/82.01; 422/82.02; 422/82.03; 436/149; 436/150; 436/151

(58) Field of Classification Search
    USPC ................... 205/76, 341–342, 413–414, 419; 422/82.01–82.03; 436/149–151
    See application file for complete search history.

(56) References Cited

U.S. PATENT DOCUMENTS 5,540,981 A * 7/1996 Gallagher et al. ............ 428/220
5,573,972 A * 11/1996 Kobayashi .................... 438/405
6,461,934 B2 * 10/2002 Nishida et al. ................ 438/424
7,737,533 B2 * 6/2010 Dai et al. ....................... 257/653
7,772,125 B2 * 8/2010 Kawashima et al. ......... 438/701
7,871,531 B2 * 1/2011 Sugimoto ....................... 216/27
8,034,222 B2 * 10/2011 Myung et al. ............ 204/403.01

(Continued)

FOREIGN PATENT DOCUMENTS

JP    2004-136377 A    5/2004
JP    2004-193325 A    7/2004

(Continued)

OTHER PUBLICATIONS

Yun, M. et al, Nano Letters 2004, 4, 419-422.*

(Continued)

*Primary Examiner* — Arlen Soderquist
(74) *Attorney, Agent, or Firm* — Marshall, Gerstein & Borun LLP

(57) ABSTRACT

The present invention relates to a method for manufacturing a micro wire, a sensor including the micro wire, and a method for manufacturing the sensor, having improved production efficiency. According to an embodiment of the present invention, a method for manufacturing a micro wire includes applying a three-dimensional electric field to a solution for forming a micro wire. The method for manufacturing the micro wire may further include providing an electrode assembly comprising a substrate, a first electrode and a second electrode formed on the substrate, and providing the solution to a space. The first electrode and the second electrode may form the space therebetween, and the space may have a first width and a second width that is smaller than the first width. The three-dimensional electric field is applied to the solution by applying a voltage to the first electrode and the second electrode.

35 Claims, 13 Drawing Sheets

(56) References Cited

U.S. PATENT DOCUMENTS

| | | | |
|---|---|---|---|
| 8,187,865 B2* | 5/2012 | Yun et al. | 435/287.2 |
| 2003/0048619 A1* | 3/2003 | Kaler et al. | 361/760 |
| 2005/0056828 A1* | 3/2005 | Wada et al. | 257/40 |
| 2005/0064618 A1* | 3/2005 | Brown et al. | 438/49 |
| 2005/0079659 A1* | 4/2005 | Duan et al. | 438/197 |
| 2005/0253220 A1* | 11/2005 | Lin et al. | 257/536 |
| 2006/0188934 A1* | 8/2006 | Chang et al. | 435/7.1 |
| 2006/0207878 A1* | 9/2006 | Myung et al. | 204/403.09 |
| 2006/0258132 A1* | 11/2006 | Brown et al. | 438/610 |
| 2006/0281321 A1* | 12/2006 | Conley et al. | 438/703 |
| 2007/0051942 A1* | 3/2007 | Brown et al. | 257/40 |
| 2007/0105321 A1* | 5/2007 | Lee et al. | 438/270 |
| 2007/0110639 A1* | 5/2007 | Joshi et al. | 422/130 |
| 2008/0073319 A1* | 3/2008 | Sugimoto | 216/27 |
| 2008/0128688 A1* | 6/2008 | Pan et al. | 257/40 |
| 2008/0206936 A1* | 8/2008 | Fernandez-Ceballos et al. | 438/151 |
| 2008/0246021 A1* | 10/2008 | Suk et al. | 257/24 |
| 2008/0303029 A1* | 12/2008 | Kawashima et al. | 257/72 |
| 2009/0242405 A1* | 10/2009 | Mayer et al. | 204/435 |
| 2009/0242416 A1* | 10/2009 | Yun et al. | 205/181 |
| 2009/0291311 A1* | 11/2009 | Chew et al. | 428/409 |
| 2009/0294303 A1* | 12/2009 | Fischer et al. | 205/780.5 |

FOREIGN PATENT DOCUMENTS

| | | |
|---|---|---|
| JP | 2005-164871 A | 6/2005 |
| JP | 2006-054072 A | 2/2006 |
| JP | 2007-123657 A | 5/2007 |

OTHER PUBLICATIONS

Ramanathan, K. et al, Nano Letters 2004, 4, 1237-1239.*
Murakami, Y. et al, Analytical Chemistry 1993, 65, 2731-2735.*
Shibuya, M. et al, Journal of Electroanalytical Chemistry 1995, 396, 535-540.*
Chen, G. Z. et al, Advanced Materials 2000, 12, 522-526.*
Sih, B. C. et al, Chemistry of Materials 2004, 16, 2712-2718.*
Wang, J. et al, Langmuir 2005, 21, 9-12.*
Kumar, S. S. et al, Journal of Electroanalytical Chemistry 2005, 578, 95-103.*
Kaempgen, M. et al, Journal of Electroanalytical Chemistry 2006, 586, 72-76.*
Oliveira, M. M. et al, Journal of Physical Chemistry B 2006, 110, 17063-17069.*
Zhang, T. et al, Electroanalysis 2006, 18, 1153-1158.*
Wang, Z. et al, Journal of Electroanalytical Chemistry 2007, 599, 121-126.*
Ramanathan, K. et al, Electroanalysis 2007, 19, 793-797.*
Fan, J. et al, Journal of Applied Polymer Science 1999, 74, 2605-2610.*
Gao, M. et al, Angewandte Chemie International Edition, 2000, 39, 3664-3667.*
Zhang, X. et al, Journal of Physical Chemistry B 2005, 105, 1101-1107.*
Zhang, X. et al, Carbon 2005, 43, 2186-2191.*
Hughes, M. et al, Composite Science and Technology 2004, 2325-2331.*
Li, Y. et al, Biosensors and Bioelectronics 2007, 22, 3120-3125.*
An et al., "Fabrication of Carbon Nanotube Bridge in V-Groove Channel Using Dielectrophoresis," Proceedings of the 7th IEEE International Conference on Nanotechnology, pp. 511-514 (2007).

* cited by examiner

METHOD FOR MANUFACTURING CARBON NANOTUBE CONTAINING CONDUCTIVE MICRO WIRE AND SENSOR INCLUDING THE MICRO WIRE

CROSS-REFERENCE TO RELATED APPLICATION

This application claims priority to and the benefit of Korean Patent Application No. 10-2007-0110517 filed in the Korean Intellectual Property Office on Oct. 31, 2007, the entire contents of which are incorporated herein by reference.

BACKGROUND OF THE INVENTION (a) Field of the Invention

The present invention relates to a method for manufacturing a micro wire. More particular, the present invention relates to a method for manufacturing a micro wire, a sensor including the micro wire, and a method for manufacturing the sensor, having improved production efficiency.

(b) Description of the Related Art

Recently, attention to nanotechnology for manufacturing nano-scaled components and devices has increased, and intensive research thereof has been conducted.

Methods for manufacturing nano-scaled components and devices may be classified to a top-down method and a bottom-up method. In the top-down method, unwanted portions are removed from a film or a mass to manufacture nano-scaled components. In the bottom-up method, small blocks are stocked by self assembly to manufacture nano-scaled components.

The bottom-up method may be judged to solve problems of the top-down method, and intensive research thereof has been conducted. The bottom-up method is currently applied to manufacture one-dimensional nano-scaled components such as metal or oxide micro wires, and polymer micro/nano wires. Since the one-dimensional nano-scaled components have excellent electrical, thermal, mechanical, optical characteristics, they may be used for various nano-scaled devices such as electrical devices, optical devices, and chemical/bio sensors.

However, the bottom-up method may be possible only in the research. According to the bottom-up method, a micro wire can be manufactured only when strict conditions are maintained for a long time using expensive equipment. Thus, production efficiency of the micro wire is extremely low. Further, it is difficult to adjust the shape and the location of the micro wire.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a method for manufacturing a micro wire having advantages of improving production efficiency and adjusting a shape and location of the micro wire.

Another embodiment of the present invention provides a sensor including a micro wire and a method for manufacturing the sensor having advantages of improving production efficiency and adjusting a shape and location of the micro wire.

According to an embodiment of the present invention, a method for manufacturing a micro wire includes applying a three-dimensional electric field to a solution for forming a micro wire. The three-dimensional electric field facilitates formation of the micro wire having improved characteristics.

The method for manufacturing the micro wire may further include providing an electrode assembly including a substrate, and a first electrode and a second electrode formed on the substrate with a space therebetween to which the solution is provided. The space may have a first width and a second width that is smaller than the first width. The three-dimensional electric field is applied to the solution by applying a voltage to the first electrode and the second electrode. Since the space between the first electrode and the second electrode has the first and second widths, a portion where the width of the space is changed exists in the space. The three-dimensional electric field is generated at the portion.

The width of the space may gradually decrease toward the inside of the substrate. Accordingly, the three-dimensional electric field can be uniformly formed with a large area.

Each of the first electrode and the second electrode may include an opposing portion. The opposing portion of the first electrode and the opposing portion of the second electrode may face each other while forming the space therebetween. An area where the three-dimensional electric field is applied can be increased by the opposing portions, thereby further facilitating the formation of the micro wire.

At least one of the opposing portions of the first electrode and the second electrode may have a quadrangular shape. Selectively, at least one of the opposing portions of the first electrode and the second electrode may have a width that gradually decreases toward the other opposing portion.

In the exemplary embodiment, the shape and location of the micro wire can be adjusted by changing shapes of the first electrode and the second electrode so that the micro wire has excellent characteristics that are appropriate for applications of the micro wire.

The providing of the electrode assembly may include providing the substrate, forming a groove on the substrate, and forming the first and second electrodes. The first electrode may be formed on at least a first surface of the groove, and the second electrode may be formed on at least a second surface of the groove facing the first surface. The electrode assembly applying the three-dimensional electric field can be easily manufactured by a simple process of forming the groove on the substrate.

The providing of the electrode assembly may include providing the substrate, forming a first oxidation layer on the substrate, forming a groove on the substrate and the first oxidation layer, removing the first oxidation layer, forming a second oxidation layer on the substrate, and forming the first and second electrodes on the second oxidation layer. The first electrode may be formed at least a portion corresponding to a first surface of the groove, and the second electrode may be formed at least a portion corresponding to a second surface of the groove facing the first surface. The second oxidation layer may protect the first and second electrodes and insulate the substrate from the first and second electrodes.

The substrate may be a silicon substrate. Accordingly, the groove of a notch shape can be easily formed by the etching characteristic of silicon.

The three-dimensional electric field may be generated by applying an AC voltage to the first and second electrodes. Thus, the present exemplary embodiment does not need expensive equipment for generating electric signals having complicated waveforms. The shape and the location of the micro wire can be adjusted by changing the frequency of the AC voltage.

The AC voltage may have frequency of 10 kHz to 10 MHz. The frequency of the AC voltage may be selected to be appropriate for the formation of the micro wire. Thus, the present invention is not limited to the above frequency.

In the providing of the solution to the space, the solution may be dripped to the space or the electrode assembly may be immersed in the solution. Thus, in the exemplary embodiment, an appropriate method may be used according to the circumstances.

The micro wire may include a conductive polymer. The conductive polymer has excellent flexibility, chemical stability, and biocompatibility, unlike a metal, and thus can be applicable to various devices.

The solution may include a solvent, a monomer of the conductive polymer, and a catalyst. The catalyst facilitates polymerization of the monomer of the conductive polymer.

The catalyst may include a material selected from a group consisting of carbon nanotubes (CNT) and gold nanoparticles. Various materials may be used as the catalyst. For example, the catalyst may be integrated at a predetermined portion and concentrate a current at the portion. Thus, the polymerization of the monomer of the conductive polymer can be facilitated by concentrating the current.

The monomer of the conductive polymer may include one or more materials selected from a group consisting of pyrrole, aniline, acetylene, thiophene, isothiophene, phenylene, toluidine, azine, acene, azulene, pyridine, and indole.

The solution may be formed by mixing the catalyst with the solvent, and adding the monomer of the conductive polymer to the solvent mixed with the catalyst. The weight % of the catalyst to the solution may be 0.01 to 5. Preferably, the weight % of the catalyst may be 0.01 to 1.

The shape and the location of the micro wire can be adjusted by appropriately changing the ratio of the catalyst to the monomer of the conductive polymer.

The micro wire manufactured by the exemplary embodiment may be used for various nano-scaled or micro-scaled devices in a state in which the micro wire is separated from the electrode assembly or in a state in which the micro wire is connected to the electrode assembly.

The micro wire may have a diameter of a few nanometers to several hundred micrometers. According to another embodiment of the present invention, a method is provided for manufacturing a sensor, including providing an electrode assembly including a substrate, a first electrode, and a second electrode, providing a solution for forming a micro wire to a space, and applying a three-dimensional electric field to the solution to form a micro wire connected to the first electrode and the second electrode. The first electrode and the second electrode are formed on the substrate, and form the space therebetween. The space has a first width and a second width that is smaller than the first width. The three-dimensional electric field facilitates formation of the micro wire having improved characteristics. Also, since the micro wire of the sensor is connected to the first electrode and the second electrode, the conventional processes in which the micro wire is separately formed and connected to the electrodes can be omitted.

A width of the space may gradually decrease toward the inside the substrate. Accordingly, the three-dimensional electric field can be uniformly formed with a large area, and the micro wire of the sensor can be stably formed.

Each of the first electrode and the second electrode may include an opposing portion. The opposing portion of the first electrode and the opposing portion of the second electrode may face each other while forming the space therebetween. An area where the three-dimensional electric field is applied can be increased by the opposing portions, thereby further facilitating the formation of the micro wire.

At least one of the opposing portions of the first electrode and the second electrode may have a quadrangular shape. Selectively, at least one of the opposing portions of the first electrode and the second electrode may have a width that gradually decreases toward the other opposing portion.

In the exemplary embodiment, the shape and location of the micro wire can be adjusted by changing shapes of the first electrode and the second electrode so that the micro wire has excellent characteristics that are appropriate for applications of the micro wire.

The providing the electrode assembly may include providing the substrate, forming a groove on the substrate, and forming the first and second electrodes. The first electrode may be at least formed on a first surface of the groove, and the second electrode may be at least formed on a second surface of the groove facing the first surface. The electrode assembly applying the three-dimensional electric field can be easily manufactured by a simple process of forming the groove on the substrate.

The providing of the electrode assembly may include providing the substrate, forming a first oxidation layer formed on the substrate, forming a groove on the substrate and the first oxidation layer, removing the first oxidation layer, forming a second oxidation layer on the substrate, and forming the first and second electrodes on the second oxidation layer. The first electrode may be formed at least a portion corresponding to a first surface of the groove, and the second electrode may be formed at least a portion corresponding to a second surface of the groove facing the first surface. The second oxidation layer may protect the first and second electrodes and insulate the substrate from the first and second electrodes.

The substrate may be a silicon substrate. Accordingly, the groove of a notch shape can be easily formed by the etching characteristic of silicon.

The three-dimensional electric field may be generated by applying an AC voltage to the first and second electrodes. Thus, the present exemplary embodiment does not need expensive equipment for generating electric signals having complicated waveforms. The shape and the location of the micro wire can be adjusted by changing the frequency of the AC voltage.

The AC voltage may have frequency of 10 kHz to 10 MHz. The frequency of the AC voltage may be selected to be appropriate for the formation of the micro wire. Thus, the present invention is not limited to the above frequency.

In the providing of the solution to the space, the solution may be dripped to the space or the electrode assembly may be immersed in the solution. Thus, in the exemplary embodiment, an appropriate method may be used according to the circumstances.

The micro wire may include a conductive polymer. The conductive polymer has excellent flexibility, chemical stability, and biocompatibility, unlike a metal, and thus can be applicable to various devices.

The solution may include a solvent, a monomer of the conductive polymer, and a catalyst. The catalyst facilitates polymerization of the monomer of the conductive polymer.

The catalyst may include a material selected from a group consisting of carbon nanotubes (CNT) and gold nanoparticles. Various materials may be used as the catalyst. For example, the catalyst may be integrated at a predetermined portion, and may concentrate current at the portion. Thus, the polymerization of the monomer of the conductive polymer can be facilitated by concentrating the current.

The monomer of the conductive polymer may include one or more materials selected from a group consisting of pyrrole, aniline, acetylene, thiophene, isothiophene, phenylene, toluidine, azine, acene, azulene, pyridine, and indole.

The solution may be formed by mixing the catalyst with the solvent, and adding the monomer of the conductive polymer to the solvent mixed with the catalyst. The weight % of the catalyst to the solution may be 0.01 to 5. Preferably, the weight % of the catalyst may be 0.01 to 1.

The shape and the location of the micro wire can be adjusted by appropriately changing the ratio of the catalyst to the monomer of the conductive polymer.

The micro wire may have a diameter of a few nanometers to several hundred micrometers. A sensor according to an exemplary embodiment includes a substrate having a groove, a first electrode and a second electrode formed on the substrate and forming a space therebetween, and a micro wire electrically connecting the first electrode to the second electrode. The space has a first width and a second width that is smaller than the first width.

The width of the space may gradually decrease toward the inside the substrate. The groove may have a notch shape in cross-section.

Each of the first electrode and the second electrode may include an opposing portion. The opposing portion of the first electrode and the opposing portion of the second electrode may face each other while forming the space therebetween. At least one of the opposing portions of the first electrode and the second electrode may have a quadrangular shape. Selectively, at least one of the opposing portions of the first electrode and the second electrode may have a width that gradually decreases toward the other opposing portion.

The substrate may be a silicon substrate. An oxidation layer may be further included between the substrate and the first and second electrodes.

The micro wire may include a conductive polymer. The micro wire may further include a catalyst. The catalyst may include a material selected from a group consisting of carbon nanotubes (CNT) and gold nanoparticles. The micro wire may have a diameter of a few nanometers to several hundred micrometers.

DETAILED DESCRIPTION OF THE EMBODIMENTS

Exemplary embodiments of a method for manufacturing a micro wire, a sensor including the micro wire, and a method for manufacturing the sensor according to the present invention will now be described in detail with reference to the accompanying drawings. A micro wire indicates a micro wire of a nano-scale size and a micro-scale size. More specifically, the micro wire may have a diameter of a few nanometers to several hundred micrometers.

Referring to FIG. 1, FIG. 2A to 2g, FIG. 3A, FIG. 3B, FIG. 4A, FIG. 4B, and FIG. 5, a method for manufacturing a micro wire or a sensor according to an exemplary embodiment of the present invention will be described in detail. That is, the below method may be used for a method for manufacturing a micro wire by separating the manufactured micro wire. Selectively, the below method may be used for a method for manufacturing a sensor including an electrode assembly and a micro wire. Accordingly, hereinafter, common processes of the methods for manufacturing a micro wire and a sensor will be described at the same time.

Figure 1:
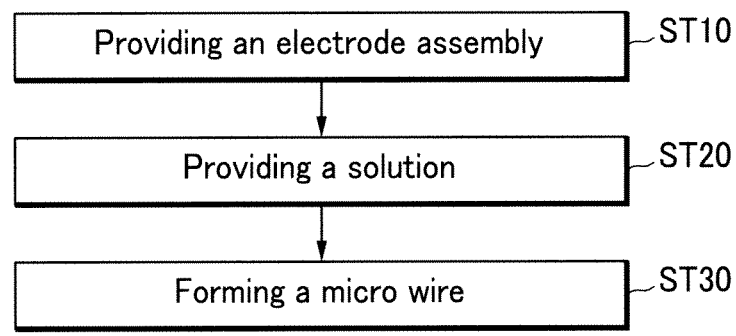
FIG. 1 is a flow chart of a method for manufacturing a micro wire or a sensor according to an exemplary embodiment of the present invention.

FIG. 1 is a flow chart of a method for manufacturing a micro wire or a sensor according to an exemplary embodiment of the present invention.

Referring to FIG. 1, a method for manufacturing a micro wire or a sensor the present exemplary embodiment includes providing an electrode assembly ST10, providing a solution for forming a micro wire ST20, and applying a three-dimensional electric field to the solution ST30 to form a micro wire.

First, referring to FIG. 2A to FIG. 2G, the providing of an electrode assembly ST10 of the present exemplary embodiment will be described. FIGS. 2A to 2G are cross-sectional views showing each process of providing an electrode assembly ST 10 in the method for manufacturing the micro wire or the sensor according to the present exemplary embodiment.

Figure 2A:
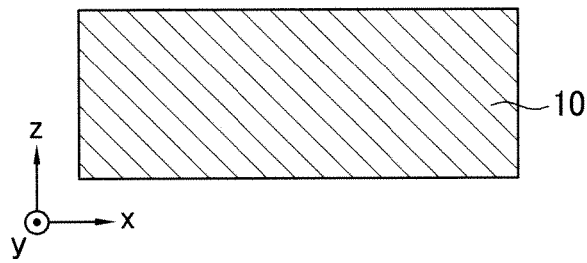
FIGS. 2A to 2G are cross-sectional views showing each process of proving an electrode assembly in the method for manufacturing the micro wire or the sensor according to an exemplary embodiment of the present invention.

As shown in FIG. 2A, a substrate 10 is provided. The substrate 10 may be a silicon substrate. However, the present invention is not limited to the material of the substrate 10. Therefore, the substrate 10 may be formed of various materials, such as a metal, a polymer, and the like, as long as the substrate 10 can support a first electrode (reference numeral 31 of FIG. 2G) and a second electrode (reference numeral 32 of FIG. 2G).

Figure 2B:
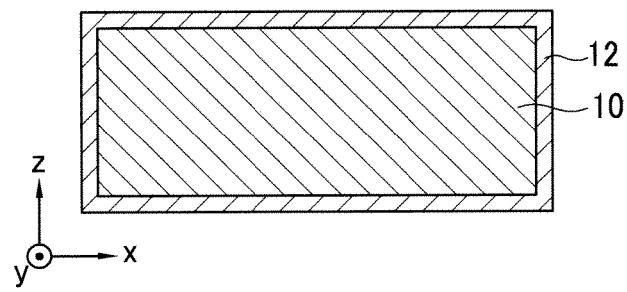

Next, as shown in FIG. 2B, a first oxidation layer 12 is formed on the substrate 10. In the present exemplary embodiment, the first oxidation layer 12 may be formed by a wet oxidation method as an example. However, the present invention is not limited thereto. Thus, the first oxidation layer 12 may be formed by various methods. The first oxidation layer 12 is a silicon oxidation layer in the present exemplary embodiment. However, the present invention is not limited thereto.

The first oxidation layer 12 prevents the substrate 10 from being etched by an etching solution used when a groove (reference numeral 20 of FIG. 2E) is formed.

Figure 2C:
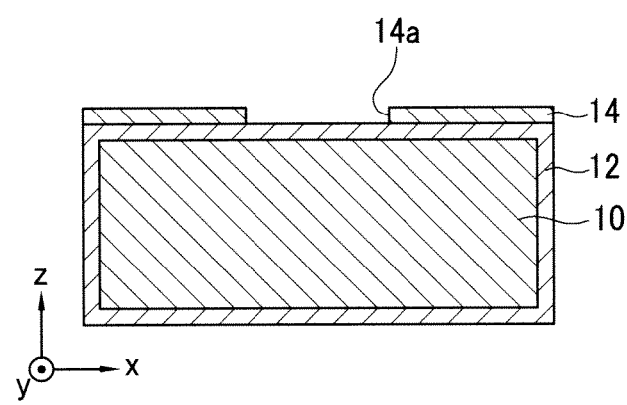

Next, as shown in FIG. 2C, a pattern layer 14 is formed on the substrate 10, more specifically, on the first oxidation layer 12. The pattern layer 14 has an opening 14a. The opening 14a of the pattern layer 14 corresponds to a groove (reference numeral 20 of FIG. 2E).

The pattern layer 14 may be formed by a photo-lithography process including printing a photoresist, and exposing and developing the same. However, the present invention is not limited thereto. The pattern layer 14 may be formed of various materials as long as the pattern layer 14 can expose a predetermined portion and protect the remaining portions.

Figure 2D:
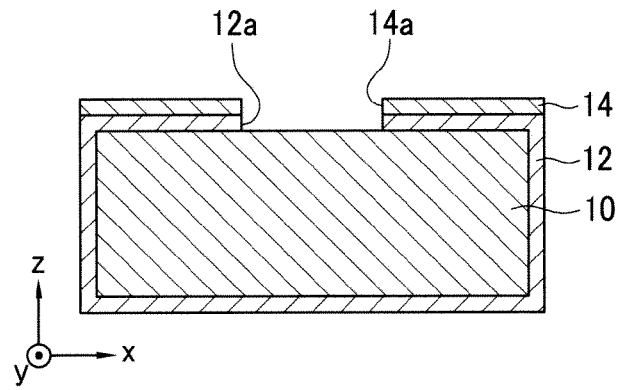

Next, as shown in FIG. 2D, an opening 12a is formed at the first oxidation layer 12 by etching a portion of the first oxidation layer 12 corresponding to the opening 14a of the pattern layer 14. In the present exemplary embodiment, the first oxidation layer 12 is etched by using buffer oxide etchant (BOE), as an example. However, the present invention is not limited thereto, and thus the first oxidation layer 12 may be etched by various etching solutions and methods.

Figure 2E:
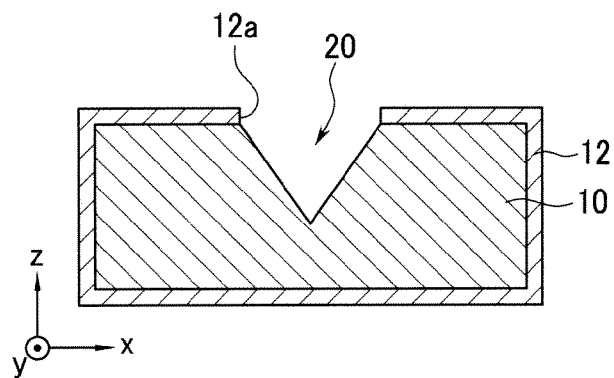

Next, as shown in FIG. 2E, a groove 20 is formed on the substrate 10 at a portion exposed by the opening 12a of the first oxidation layer 12. The groove 20 has a portion at which the width changes so that a space (reference numeral 50 of FIG. 2G) where an electric field is applied has a first width and a second width that is smaller than the first width. In the present exemplary embodiment, the groove 20 has a notch shape in cross-section, as an example. That is, the width of the groove 20 gradually decreases toward the inside of the substrate 10 (negative z-axis direction in the drawing).

In the present exemplary embodiment, the groove 20 is formed by immersing the substrate 10 in a tetramethyl-ammonium hydroxide (TMAH) solution. Since the substrate 10 of the present exemplary embodiment is formed of silicon, the substrate 10 is etched based on a crystal direction by the TMAH solution. Accordingly, the groove 20 having the notch shape can be easily formed.

However, the present invention is not limited to the shape of the groove 20. Thus, according to the etching method and the etching condition, the groove 20 may have various shapes as long as a space (reference numeral 50 of FIG. 2G) to which the electric field is applied has the first and second widths. In addition, the groove 20 having various shapes can be formed by changing the method of forming the groove 20 according to the material of the substrate 10. For example, when the substrate is made of a metal, the groove may be formed by pressing.

The pattern layer 14 is removed before forming the groove 20 or after forming the groove 20.

Figure 2F:
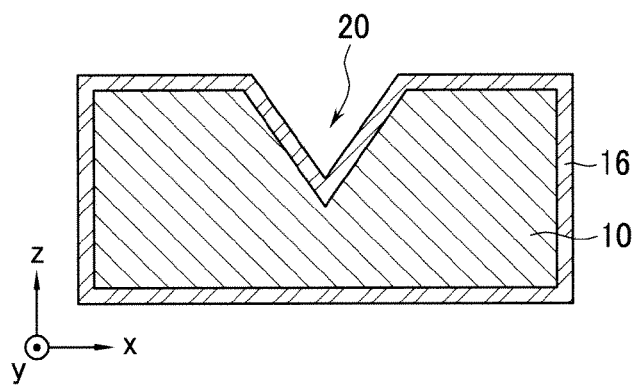

Next, as shown in FIG. 2F, the first oxidation layer 12 is removed, and a second oxidation layer 16 is formed on the substrate 10. The second oxidation layer 16 may be formed by a wet oxidation method, as an example. However, the present invention is not limited thereto, and thus the second oxidation layer 16 may be formed by using various methods. In the present exemplary embodiment, the second oxidation layer 16 may be a silicon oxidation layer. However, the present invention is not limited thereto.

The second oxidation layer 16 mechanically and chemically protects the substrate 10, and insulates the substrate 10. When the substrate 10 is made of a non-conductive material, a process of forming the second oxidation layer 16 may be omitted.

Figure 2G:
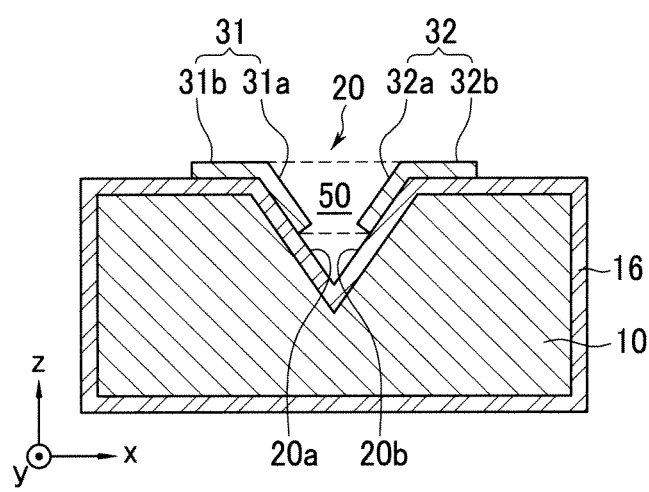

Next, as shown in FIG. 2G, an electrode assembly is manufactured by forming a first electrode 31 and a second electrode 32 on the second oxidation layer 16. The first electrode 31 is formed at a first surface 20a of the groove 20, and the second electrode 32 is formed at a second surface 20b of the groove 20 facing the first surface 20a.

The first electrode 31 and the second electrode 32 may be formed by a photo-lithography process. That is, a pattern layer, which has an opening corresponding to a portion where the first electrode 31 and the second electrode 32 will be formed, is formed, and then a conductive material is printed or deposited into the opening to form the first and second electrodes 31 and 32. Selectively, a conductive layer is formed on the substrate 10, and then a portion of the conductive layer where the first electrode 31 and the second electrode 32 are not formed is removed, to form the first and second electrodes 31 and 32. Various materials may be used as a conductive material for forming the first electrode 31 and the second electrode 32. For example, the first electrode 31 and the second electrode 32 may be formed of gold having high conductivity and low reactivity.

In the present exemplary embodiment, the first electrode 31 includes an opposing portion 31a formed on the first surface 20a, and a planar portion 31b formed on the front surface of the substrate 10 adjacent to the first surface 20a. The second electrode 32 includes an opposing portion 32a formed on the second surface 20b, and a planar portion 32b formed on the front surface of the substrate 10 adjacent to the second surface 20b. Here, the planar surfaces 31b and 32b are not essential.

The opposing portion 31a of the first electrode 31 is formed on the first surface 20a, and the opposing portion 32a of the second electrode 32 is formed on the second surface 20b. Thus, the opposing portions 31a and 32a face each other. A space 50 is formed between the opposing portion 31a of the first electrode 31 and the opposing portion 31b of the second electrode 32. Since the space 50 corresponds to the groove 20, the space 50 has a first width and a second width that is smaller than the first width, and a portion at which the width changes.

In the present exemplary embodiment, the width of the space 50 gradually decreases toward the inside of the substrate 10 (negative z-axis direction in the drawing). In order to not be electrically short-circuited, the opposing portion 31a of the first electrode 31 and the opposing portion 32a of the second electrode 32 are spaced from each other at a vertex of the groove 20. Accordingly, in the present exemplary embodiment, the space 50, which is formed between the opposing portion 31a of the first electrode 31 and opposing portion 32a of the second electrode 32, has an inverted trapezoid shape.

Figure 3A:
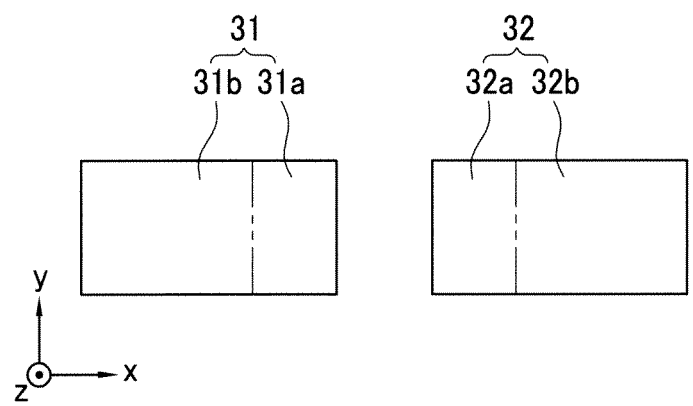
FIG. 3A is a top plan view of a first electrode and a second electrode according to an exemplary embodiment of the present invention.
Figure 3B:
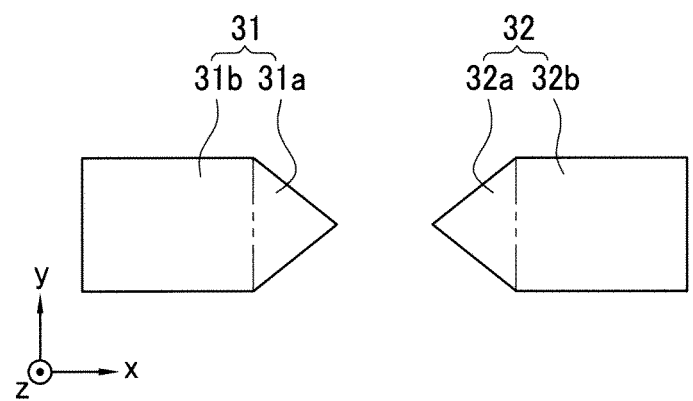
FIG. 3B is a top plan view of a first electrode and a second electrode according to another exemplary embodiment of the present invention.

As shown in FIGS. 3A and 3B, the first electrode 31 and the second electrode 32 may have various shapes. FIGS. 3A and 3B are top plan views of the first electrode 31 and the second electrode 32 according to various exemplary embodiments of the present invention.

As shown in FIG. 3A, the first electrode 31 and the second electrode 32 may have a quadrangular shape, as an example. Thus, the opposing portions 31a and 32a of the first and second electrodes 31 and 32 may have quadrangular shapes. Selectively, as shown in FIG. 3B, the opposing portions 31a and 32a of the first and second electrodes 31 and 32 have widths that gradually decrease toward each other.

However, the present invention is not limited thereto. Thus, whole portions of the first and second electrode 31 and 32 may have widths that gradually decrease toward each other. In addition, the first electrode 31 and the second electrode 32 may have polygon shapes, but are not quadrangular.

In the present exemplary embodiment, the shape and the location of the micro wire 80 can be adjusted by changing shapes of the first electrode 31 and the second electrode 32.

The electrode assembly is an element that applies the electric field to the solution to form a micro wire. More particularly, the electric field is applied to the space between the first electrode 31 and the second electrode 32.

Figure 4A:
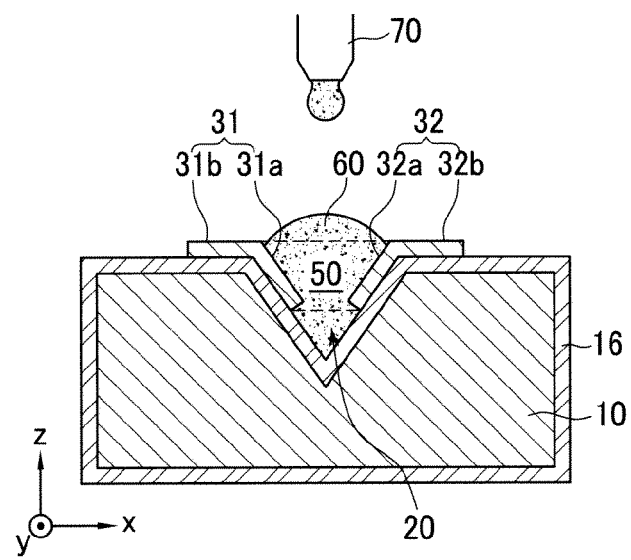
FIG. 4A is a cross-sectional view showing provision of a solution for forming a micro wire in the method for manufacturing the micro wire or the sensor according to an exemplary embodiment of the present invention.
Figure 4B:
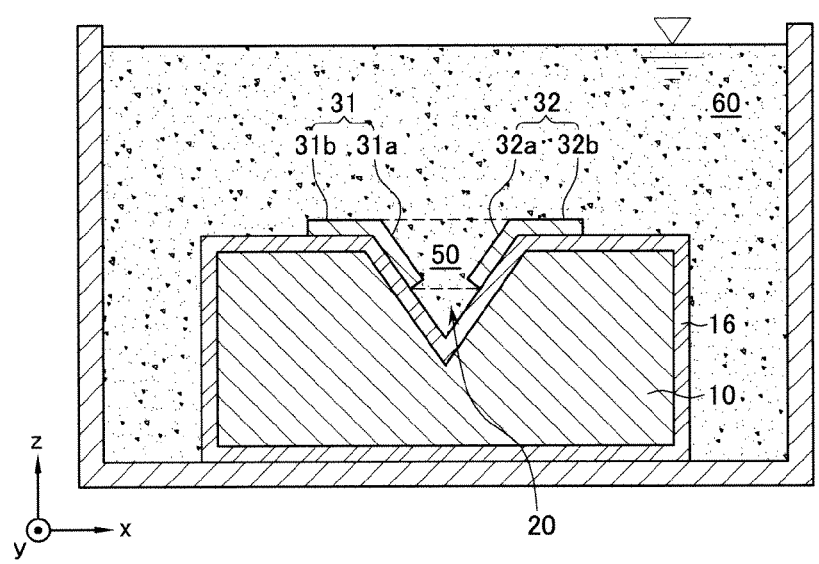
FIG. 4B is a cross-sectional view showing provision of a solution for forming a micro wire in the method for manufacturing the micro wire or the sensor according to another exemplary embodiment of the present invention.

Next, referring to FIGS. 4A and 4B, the provision of the solution for forming the micro wire ST20 in the manufacturing method according to the present exemplary embodiment will be described. FIG. 4A is a cross-sectional view showing the provision of the solution for forming the micro wire according to an exemplary embodiment, and FIG. 4A is a cross-sectional view showing provision of a solution for forming a micro wire according to another exemplary embodiment.

As shown in FIG. 4A, the solution 60 may be dripped to the space 50 by a dripping apparatus 70. Selectively, as shown in FIG. 4B, the solution 60 may be provided to the space 50 by immersing the electrode assembly in the solution 60. Thus, in the present exemplary embodiment, an appropriate method may be used according to the manufacturing circumstances.

In the present exemplary embodiment, the solution 60 may include a solvent, a monomer of the conductive polymer, a catalyst facilitating polymerization of the monomer, and a dispersing agent dispersing the solvent, the monomer, and the catalyst.

The solvent may be water or an organic solvent. The organic solvent may be methanol, ethanol, isopropanol, butanol, acetone, acetonitrile, toluene, dichloromethane, dimethyl formamide (DMF), dimethyl sulfoxide (DMSO), tetrahydrofuran (THF), or propylene carbonate.

The monomer of the conductive polymer may be pyrrole, aniline, acetylene, thiophene, isothiophene, phenylene, toluidine, azine, acene, azulene, pyridine, or indole.

The catalyst may be carbon nanotubes (CNT) or gold nanoparticles.

The dispersing agent may be sodium dodecylsulfate.

The solution 60 may be formed by mixing the catalyst and the dispersing agent with the solvent, and mixing the monomer of the conductive polymer with the solvent mixed with the catalyst and the dispersing agent. Then wt % of the catalyst to the solution may be 0.01 to 5 when the catalyst is carbon nanotubes. When the carbon nanotubes are present at below 0.01 wt %, the formation of the micro wire may be difficult. When the carbon nanotubes are present at above 5 wt %, the carbon nanotubes may stick to the first and second electrodes 31 and 32 and be clustered with each other. Thus, the carbon nanotubes at 0.01 wt % to 1 wt % may be added.

The concentration of the monomer to the solution with the catalyst and the dispersing agent may be 0.1M to 1M. The above concentration is for an appropriate polymerization reaction.

However, the present invention is not limited thereto. Various materials may be used as the solvent, the monomer, the catalyst, and the dispersing agent, and the ratio thereof may be changed according to the materials.

Figure 5:
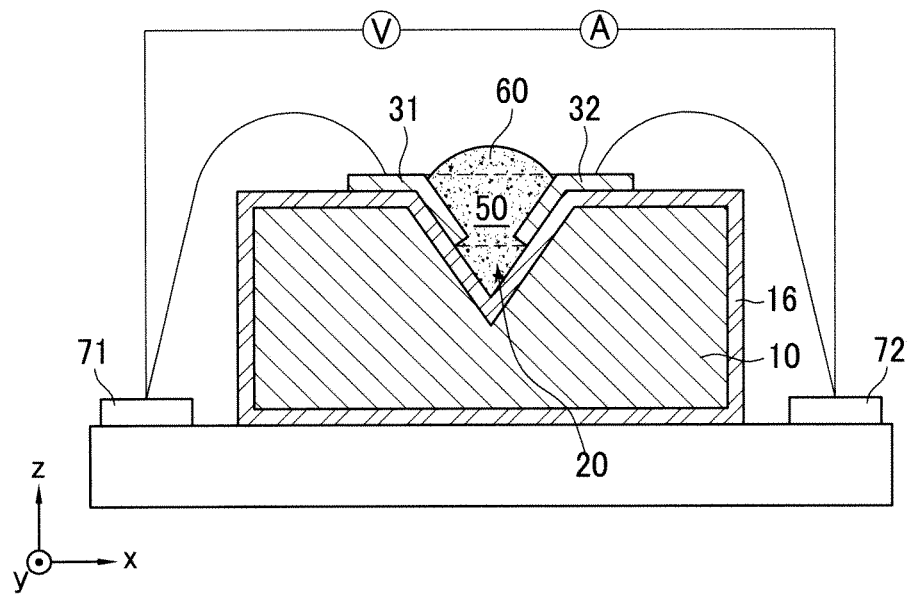
FIG. 5 is a cross-sectional view showing formation of a micro wire in the method for manufacturing the micro wire or the sensor according to an exemplary embodiment of the present invention.

Finally, the applying of three-dimensional electric field ST30 to form a micro wire will be described with reference to FIG. 5. FIG. 5 is a cross-sectional view showing formation of a micro wire according to the present invention exemplary embodiment. As an example, in FIG. 5, the solution 60 is dripped to the space 50 in FIG. 5.

Figure 6:
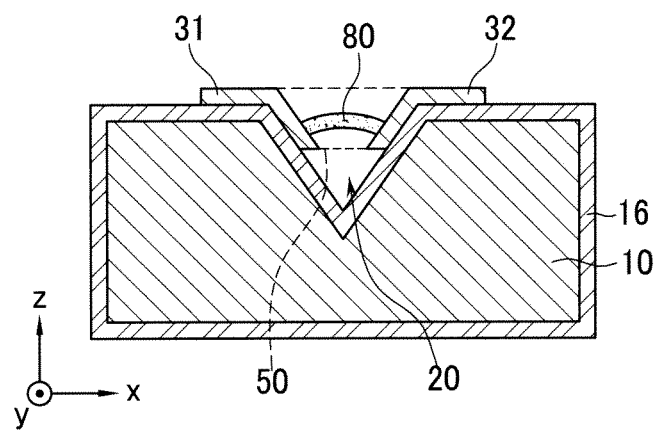
FIG. 6 is a cross-sectional view of a sensor including a micro wire according to an exemplary embodiment of the present invention.

Next, as shown in FIG. 5, when a voltage is applied to the first and second electrodes 31 and 32 through a first terminal 71 and a second terminal 72, the electric field is applied to the solution, thereby forming a micro wire (reference numeral 80 of FIG. 6).

In the present exemplary embodiment, because the solution includes the monomer of the conductive polymer, the micro wire is a conductive polymer micro wire. The conductive polymer has excellent flexibility, chemical stability, and biocompatibility, unlike a metal, and thus can be applicable to various devices. Specifically, the conductive polymer may be applicable to a biosensor. However, the present invention is not limited thereto. According to the solution for forming the micro wire, the micro wire may be formed of various materials.

In the present exemplary embodiment, the space 50 where the electric field is generated by the first electrode 31 and the second electrode 32 has the first width and the second width that is smaller than the first width. Thus, the space 50 has at least one portion where the width changes. The three-dimensional electric field is applied to the solution 60 inside the space 50 by the portion where the width changes. The three-dimensional electric field may be generated when the distance between the electrodes forming the electric field changes.

In the present exemplary embodiment, the gradient of the electric field by the three-dimensional electric field facilitates the formation of the micro wire. The shape and the location of the micro wire can be exactly adjusted by the gradient of the electric field by changing the shape of the space 50.

In the present exemplary embodiment, the space 50 between the first electrode 31 and the second electrode 32 can be formed by a simple process of forming the groove 20. Thus, in the present exemplary embodiment, an additional apparatus is not necessary to apply the three-dimensional electric field.

In addition, in the present exemplary embodiment, because the opposing portions 31a and 32a of the first and second electrodes 31 and 32 face each other, an area where the electric field is applied can be increased. Thus, the production efficiency of the micro wire can be improved.

The catalyst of the solution 60 facilitates the polymerization of the monomer of the conductive polymer. In the case in which the catalyst is carbon nanotubes, the carbon nanotubes are integrated at a predetermined portion of the space 50, and the current is concentrated at the portion. Then, it facilitates the polymerization of the monomer of the conductive polymer.

Accordingly, in the present exemplary embodiment, the time for the polymerization can be shortened, and the micro wire is stably manufactured. That is, according to the present exemplary embodiment, the production efficiency of the conductive polymer can be improved.

The voltage applied to the first electrode 31 and the second electrode 32 may be an AC voltage, and may have a frequency of 10 kHz to 10 MHz. Specifically, the frequency may be 100 kHz to 10 MHz. The frequency of the AC voltage may be selected to be appropriate for the formation of the micro wire.

The shape of the micro wire can be adjusted by changing the frequency of the AC voltage applied to the first electrode 31 and the second electrode 32. Thus, the above range of the frequency is an example, and the frequency may be controlled considering the composition of the solution and the shape of the micro wire.

In the present exemplary embodiment, because the AC voltage is applied to the first electrode 31 and the second electrode 32, the shape of the micro wire can be adjusted by changing the frequency of the AC voltage, without expensive equipment for generating electrical signals.

When the micro wire 80 connected the first electrode 31 and the second electrode 32 is formed, the electrode assembly and the micro wire 80 may be used as a sensor. Selectively, the manufactured micro wire 80 is used for various devices in a state in which the micro wire 80 is separated from the electrode assembly or is not separated.

When the above method is used as the method for manufacturing the sensor, the sensor is manufactured by forming the micro wire 80 connected to the first electrode 31 and the second electrode 32. Thus, the conventional processes, in which the micro wire is separately manufactured and connected to electrodes, can be omitted. Accordingly, the method for manufacturing the sensor can be simplified.

Hereinafter, referring to FIG. 6, a sensor according to an exemplary embodiment of the present invention will be described. FIG. 6 is a cross-sectional view of a sensor including a micro wire according to an exemplary embodiment of the present invention. The descriptions that have been described in the manufacturing method will be omitted.

The sensor according to the present exemplary embodiment may be manufactured by the above-mentioned method. The sensor includes an electrode assembly and a micro wire 80. The electrode assembly includes a substrate 10, and first and second electrodes 31 and 32 formed on the substrate 10. The micro wire 80 is electrically connected to the first and second electrodes 31 and 32. A groove 20 having portions of different widths is formed on the substrate 10, and the first and second electrodes 31 and 32 face each other while forming a space 50 in the groove 20.

In the present exemplary embodiment, the groove 20 has a notch shape in cross-section. However, the present invention is not limited thereto. That is, the groove 20 may have various shapes having portions of different widths so that the three-dimensional electric field can be applied to the space 50 formed inside the groove 20.

As described in the manufacturing method, the first electrode 31 and the second electrode 32 include opposing portions 31a and 32a and planar portions 31b and 32b, respectively. The opposing portions 31a and 32a face each other in the groove 20, and the space 50 is formed between the opposing portions 31a and 32a.

The space 50 corresponds to the groove 20, and thus has a width that gradually decreases toward the inside the substrate 10. The space 50 formed between the opposing portion 31a of the first electrode 31 and the opposing portion 32a of the second electrode 32, may have an inverted trapezoid shape in cross-section.

An oxidation layer may be formed between the substrate 10 and the first and second electrodes 31 and 32 to insulate them. In the present exemplary embodiment, a second oxidation layer 16 is included between the substrate 10 and the first and second electrodes 31 and 32. However, when the substrate 10 is formed of a non-conductive material, the second oxidation layer 16 is not necessary. In the present exemplary embodiment, the substrate 10 is a silicon substrate and the second oxidation layer 16 is a silicon oxidation layer, as an example. However, the present invention is not limited thereto.

In the present exemplary embodiment, the micro wire 80 may include a conductive polymer and a catalyst.

The conductive polymer may be polypyrrole, polyaniline, polyacetylene, polythiophene, polyisothiophene, polyphenylene, polytoluidine, polyazine, polyacene, polyazulene, polypyridine, and polyindole.

The catalyst may be formed of various materials that facilitate the polymerization of a monomer of the conductive polymer when the electric field is applied. For example, the catalyst may be carbon nanotubes (CNT) or gold nanoparticles.

The sensor is used for a blood-sugar sensor, an ion sensor, and a pH sensor by using electrical characteristics of the micro wire. Further, the sensor may be used for nano-scale or micro-scale research.

Hereinafter, Example 1 of the present invention and the fact that the sensor manufactured by Example 1 can be used as a pH sensor will be described.

Example 1

A first oxidation layer of silicon oxide was formed on a (100) silicon substrate. A photo sensitizer of AZ5214 was applied to the first oxidation layer, was exposed by ultraviolet rays for 17 seconds, and was developed by a developer solution of AZ300MIF. In this way, a pattern layer having an opening was formed. A portion of the first oxidation layer corresponding to the opening of the pattern layer was removed by a buffer oxide etchant.

Next, the pattern layer was removed. The silicon substrate was immersed in a TMAH solution at 80° C., and thus a groove having a notch shape was formed at a portion where the first oxidation layer was not formed.

Next, the first oxidation layer was removed. A second oxidation layer of silicon oxide was formed on the silicon substrate. A photo sensitizer of AZ5214 was applied to the second oxidation layer, was exposed by ultraviolet rays for 17 seconds, and was developed by a developer solution of AZ300MIF. Thus, another pattern layer having an opening was formed. The first electrode and the second electrode were formed by depositing inside the opening and removing the pattern layer. A space was formed between the first and second electrodes.

0.1 wt % of sodium dodecylsulfate and 1 mg of single wall carbon nanotubes were added to 100 ml of deionized water (DI water). Then, ultrasonic waves were applied thereto for 20 minutes so that the carbon nanotubes were dispersed in the solution. Pyrrole was mixed with the solution so that the concentration of the pyrrole was 0.1M.

3 µl of the solution was dripped to the space between the first and second electrodes. A micro wire connected to the first and second electrodes was formed by applying an AC voltage having a frequency of 1 MHz to the solution.

Figure 7A:
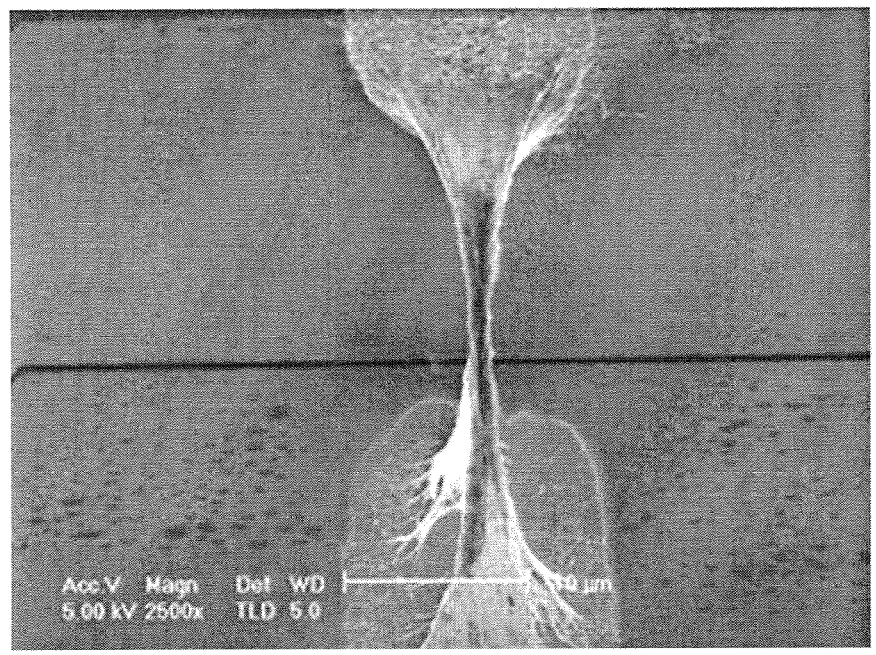
FIG. 7A is a scanning electron microscope (SEM) picture of the micro wire manufactured by Example 1.
Figure 7B:
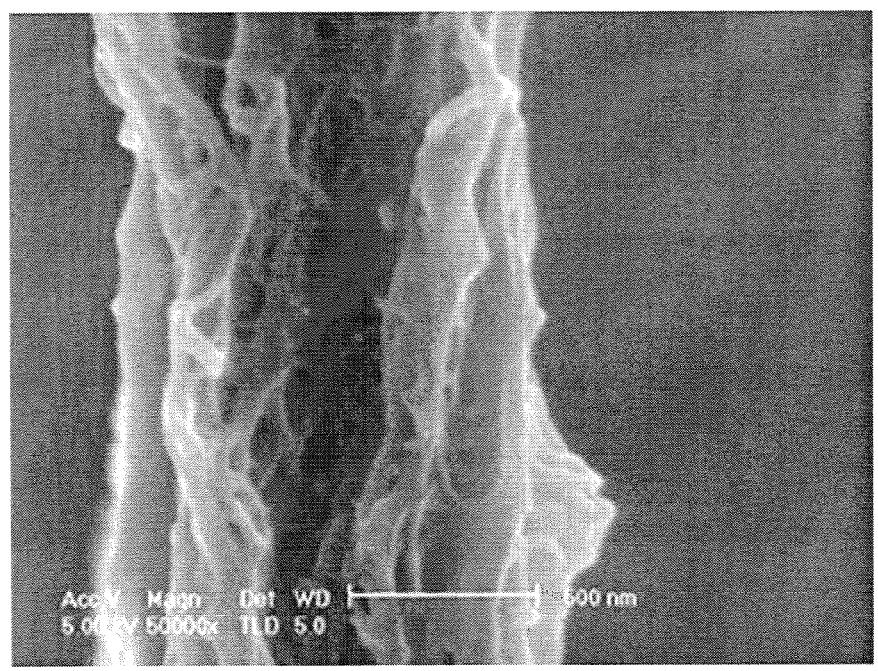
FIG. 7B is an enlarged picture of a central portion in FIG. 7A.

FIG. 7A is a scanning electron microscope (SEM) picture of the micro wire manufactured by Example 1. FIG. 7B is an enlarged picture of a central portion in FIG. 7A. Referring to FIG. 7A, according to Example 1, it can be seen that the micro wire was stably formed between the first electrode and the second electrode having a distance of several tens of micrometers therebetween. Referring to FIG. 7B, it can be seen that the micro wire has a uniform diameter of several hundred nanometers.

Figure 8A:
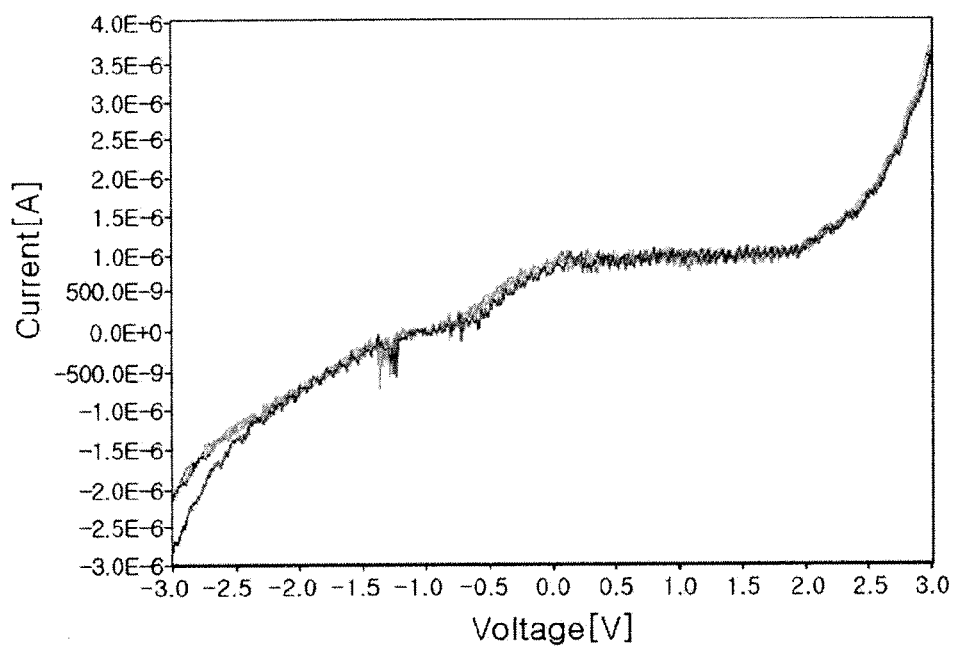
FIG. 8A is a graph showing a current of the sensor manufactured by the Example 1 according to voltage when deionized water is dripped to the sensor.
Figure 8B:
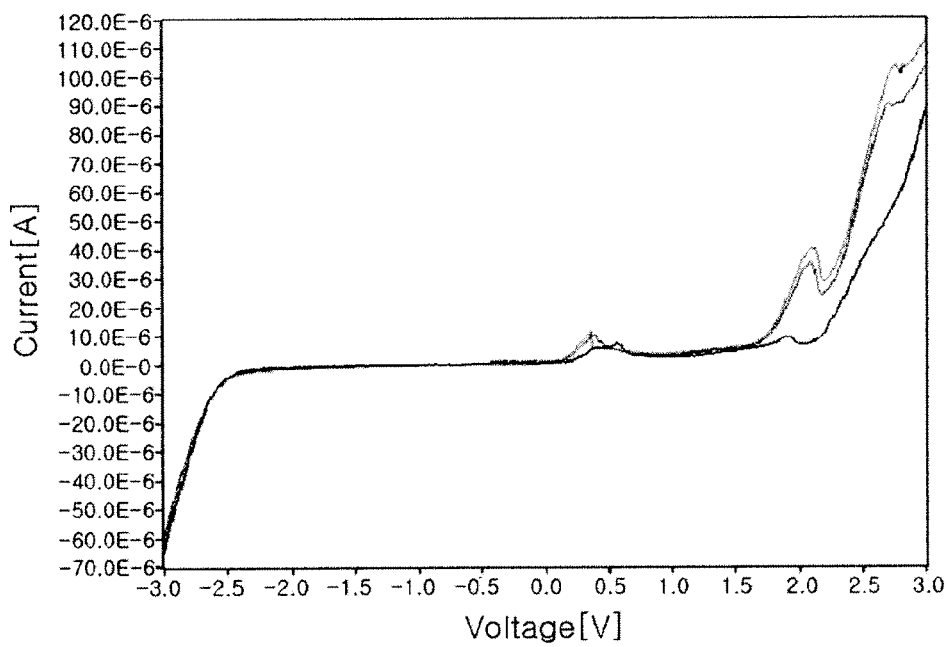
FIG. 8B is a graph showing a current of the sensor manufactured by the Example 1 according to voltage when a solution of pH 3.2 is dripped to the sensor.
Figure 8C:
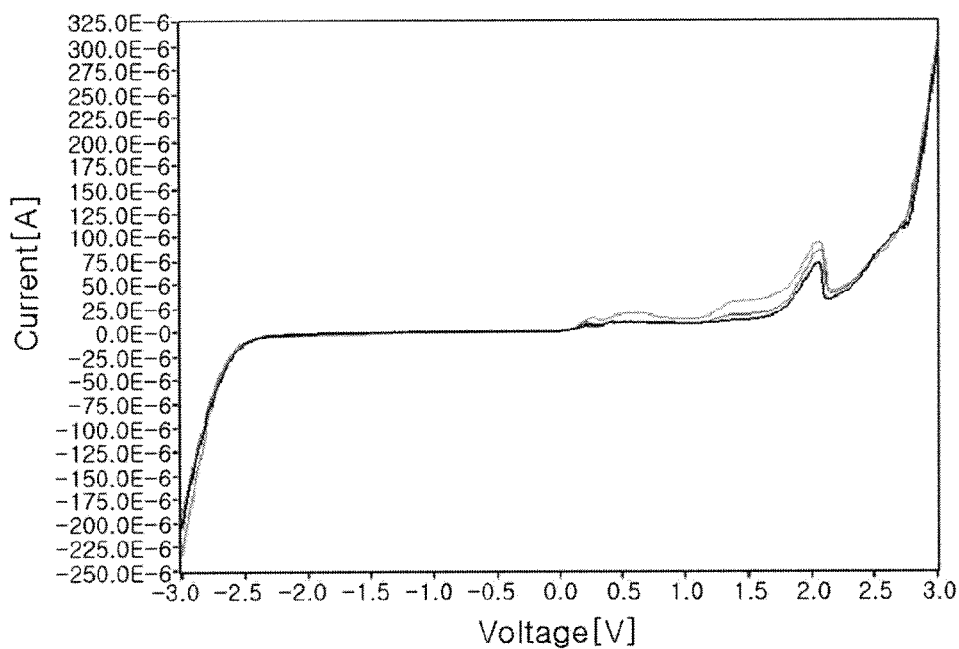
FIG. 8C is a graph showing a measured current of the sensor manufactured by the Example 1 according to voltage when a solution of pH 2.4 is dripped to the sensor.
Figure 8D:
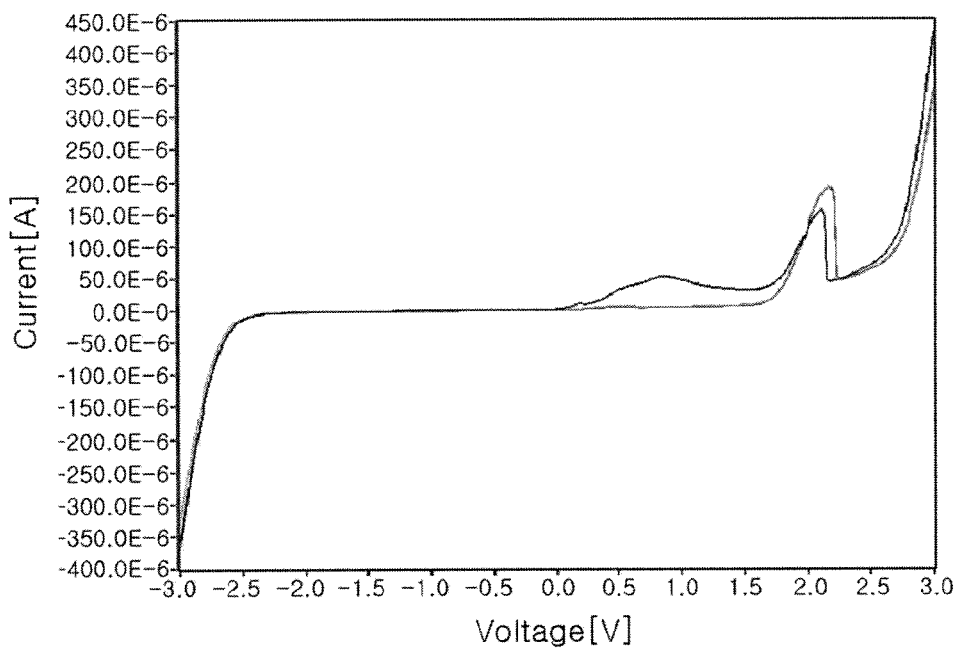
FIG. 8D is a graph showing a measured current of the sensor manufactured by the Example 1 according to voltage when a solution of pH 2.0 is dripped to the sensor.

FIGS. 8A to 8D are graphs showing a current of the sensor manufactured by the Example 1 according to voltage when deionized water, a solution of pH 3.2, a solution of pH 2.4, and a solution of pH 2.0 are dripped to the sensor, respectively. As shown in FIGS. 8A to 8D, the current does not flow at a voltage of about 0V and the current flows at a voltage above about 1V. The current is 4 µA at a voltage of 3V when the deionized water is dripped (FIG. 8A). The current is 120 µA at a voltage of 3V when the solution of pH 3.2 is dropped (FIG. 8B). The current is 325 µA at a voltage of 3V when the solution of pH 2.4 (FIG. 8C). The current is 450 µA at a voltage of 3V when the solution of pH 2.0 (FIG. 8D). That is, as the pH of the solution decreases, the amount of current increases because the resistance decreases. Thus, pH can be determined from the amount of current.

Figure 9:
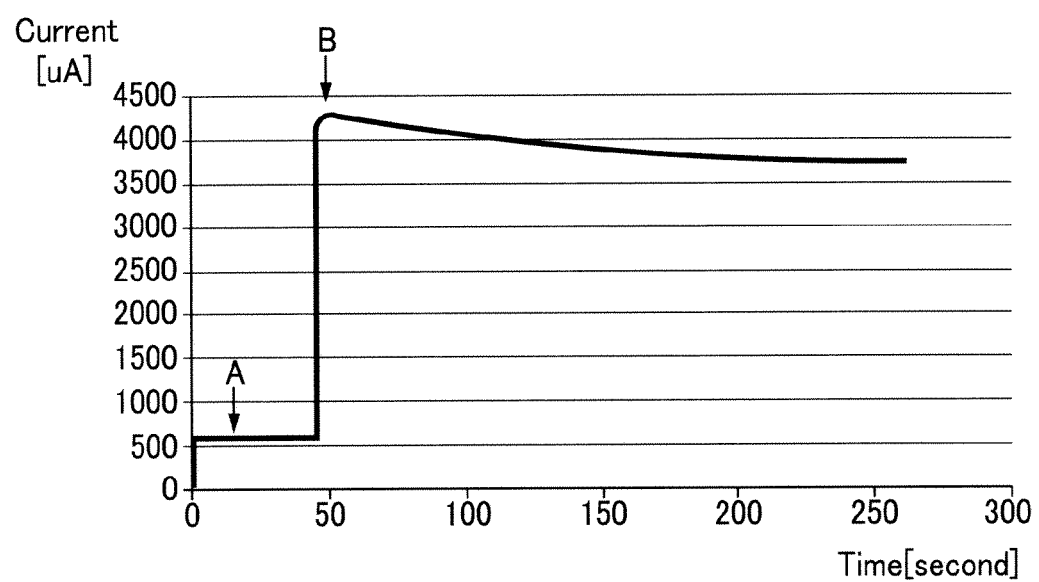
FIG. 9 is a graph showing a measured current of the sensor manufactured by the Example 1 in the case in which deionized water and a solution of pH 2 are sequentially dripped to the sensor.

FIG. 9 is a graph showing a current of the sensor manufactured by Example 1 in the case in which 5 µl of deionized water is dripped to the sensor (A of FIG. 9) and 5 µl of a solution of pH 2 is sequentially dripped to the sensor (B of FIG. 9). Here, the voltage applied to the sensor is 10V. As shown in FIG. 9, the current is 500 µA when the ionized water is dripped, while the current is drastically increased above about 4000 µA. Thus, pH can be determined from the amount of the current.

That is, it can be seen that the sensor manufactured by Example 1 can be used for a pH sensor. In Example 1, the sensor including the micro wire of polypyrrole was used for a pH sensor as an example. However, the present invention is not limited thereto. In the present invention, micro wires of various materials are applicable to various sensors.

Hereinafter, referring to Examples 2 and 3, the fact that a ratio of conductive polymer and catalyst can change the shape of a micro wire will be described.

Example 2

0.1 wt % of sodium dodecylsulfate and 1 mg of single wall carbon nanotubes were added to 100 ml of deionized water (DI water). Then, ultrasonic waves were applied thereto for 20 minutes so that the carbon nanotubes were dispersed in the solution. Pyrrole was added to the solution including the DI water and the carbon nanotubes, and mixed to manufacture a solution for forming a micro wire. A ratio of pyrrole to the solution including the DI water and the carbon nanotubes was 0.01 (about 0.15M).

A micro wire was formed between a first electrode and a second electrode by the same process as the process of Example 1, except for the process for manufacturing the solution for forming a micro wire.

Example 3

A micro wire was formed by the same process as the process of Example 2, except that a ratio of pyrrole to the solution including the DI water and the carbon nanotubes was 0.02 (about 0.3M).

Figure 10A:
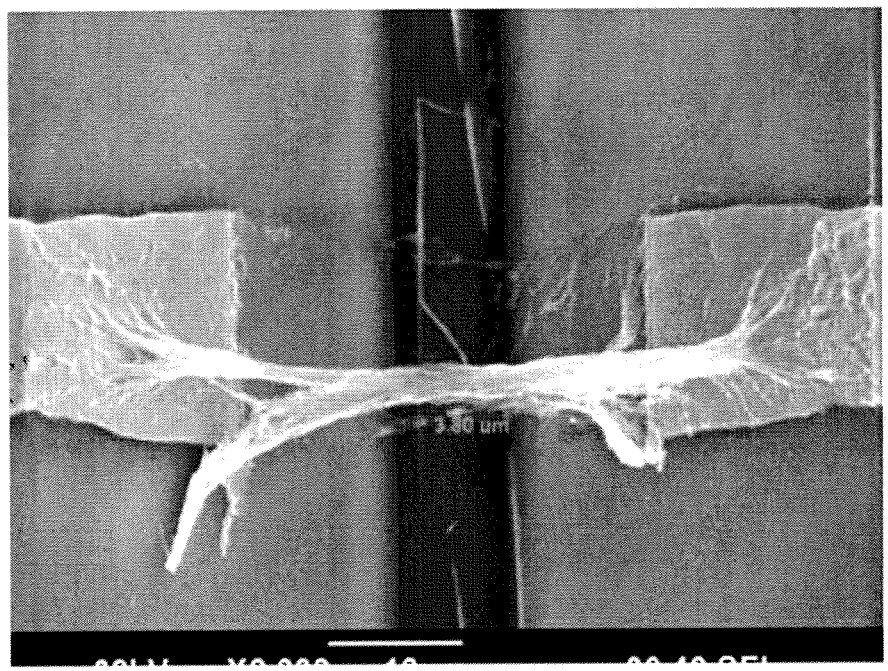
FIG. 10A is a picture of the micro wire manufactured by Example 2.
Figure 10B:
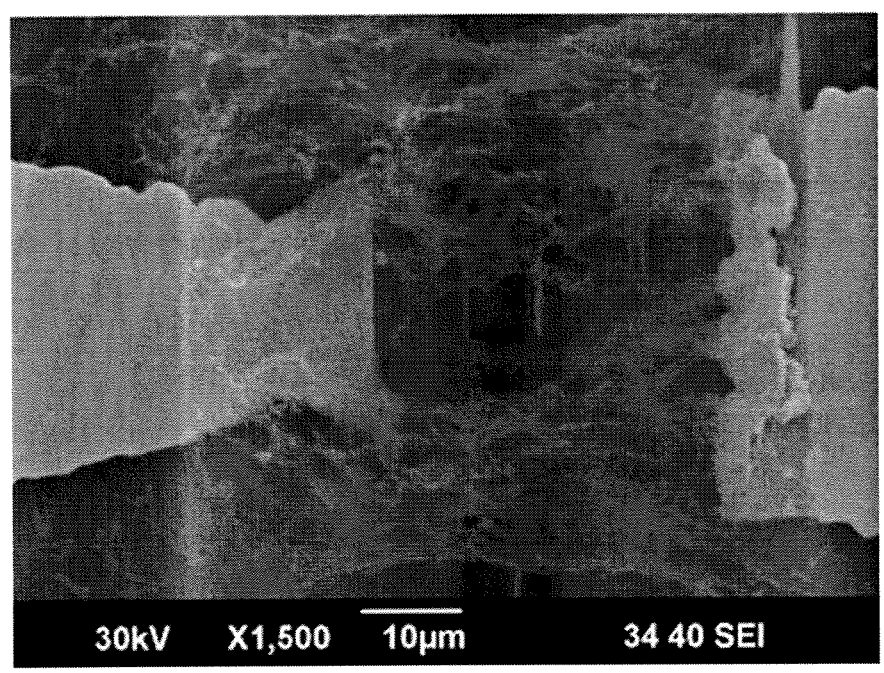
FIG. 10B is a picture of the micro wire manufactured by Example 3.

FIG. 10A is a picture of the micro wire manufactured by Example 2, and FIG. 10B is a picture of the micro wire manufactured by Example 3. Referring to FIGS. 10A and 10B, it can be seen that the micro wires manufactured by Examples 2 and 3 have different shapes.

That is, it can be seen from FIGS. 10A and 10B that micro wires having various shapes can be formed by adjusting the ratio of catalyst and monomer of conductive polymer. Accordingly, micro wires having appropriate shapes and sensors having the same can be manufactured considering applications.

Hereinafter, referring to Examples 2, 4, and 5, the fact that the frequency of the AC voltage applied to the first and second electrodes can change the shape of a micro wire will be described.

Example 4

A micro wire was formed by the same process as the process of Example 2, except that the frequency of the AC voltage applied to the first and second electrodes was 100 kHZ.

Example 5

A micro wire was formed by the same process as the process of Example 2, except that the frequency of the AC voltage applied to the first and second electrodes was 10 kHZ.

Figure 11A:
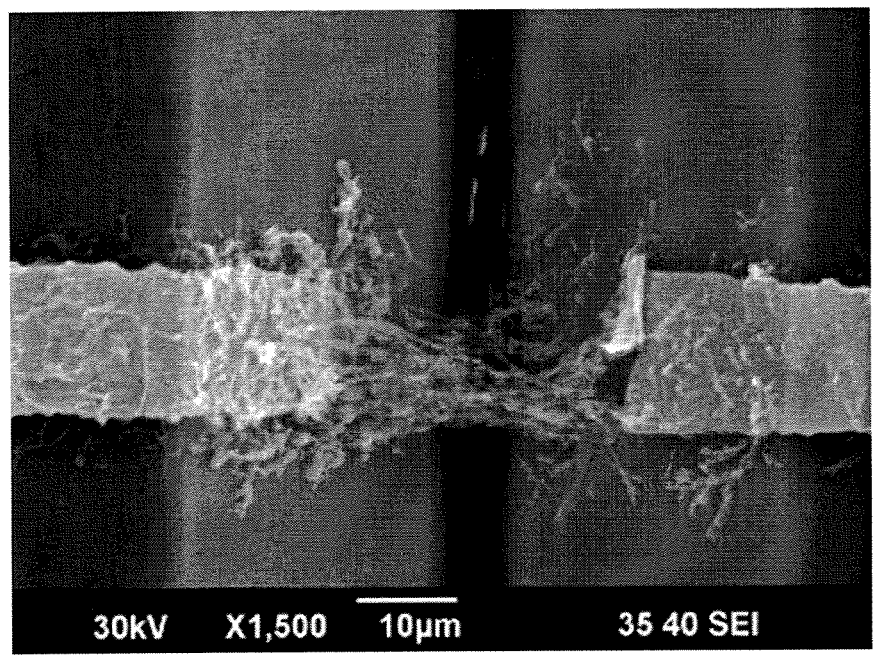
FIG. 11A is a picture of the micro wire manufactured by Example 4.
Figure 11B:
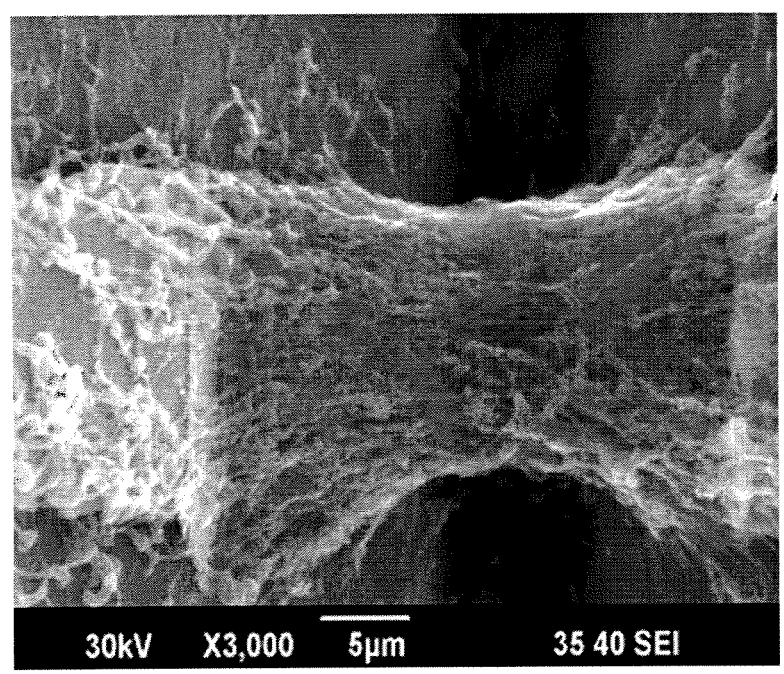
FIG. 11B is a picture of the micro wire manufactured by Example 5.

FIG. 11A is a picture of the micro wire manufactured by Example 4, and FIG. 11B is a picture of the micro wire manufactured by Example 5.

Referring to FIGS. 10A, 11A, and 11B, it can be seen that micro wires having various shapes can be manufactured according to the frequency of the AC voltage applied to the first electrode and the second electrode. That is, as the frequency increases, wires of a micro wire are clustered and thus the micro wire is thin. Also, as the frequency decreases, wires of a micro wire are not clustered and are spread.

It can be seen from FIGS. 10A, 11A, and 11B that micro wires having various shapes can be formed by adjusting the frequency of the AC voltage. Accordingly, the micro wires having appropriate shapes and the sensors having the same can be manufactured considering applications.

According to the method for manufacturing the micro wire of an exemplary embodiment, the formation of the micro wire can be facilitated by applying the three-dimensional electric field to the solution for forming the micro wire. Thus, the micro wire can be stably and easily formed. Thus, according to the exemplary embodiment, a manufacturing process can be simplified and expensive equipment is not necessary. The production efficiency can be improved.

In the exemplary embodiment, the three-dimensional electric field can be easily applied to the solution at the space, which is formed between the first electrode and the second electrode and has the first width and the second width that is smaller than the first width. Thus, additional equipment is not necessary to form the three-dimensional electric field.

Because the width of the space gradually decreases toward the inside of the substrate, the three-dimensional electric field can be uniformly formed with a large area.

The space having a predetermined shape can be easily manufactured by a simple process of forming the groove on the substrate. Thus, expensive equipment is not necessary and the manufacturing process can be simplified.

Since the first electrode and the second electrode include the opposing portions, an area where the three-dimensional electric field is applied can be increased. Thus, the formation of the micro wire can be facilitated.

The micro wire can be formed without expensive equipment for generating electrical signals having complicated waveforms, because the three-dimensional electric field is formed by the AC voltage.

By appropriately changing the shapes of the first electrode and the second electrode or the frequency of the AC voltage, the shape of the location of the micro wire can be adjusted. Accordingly, the micro wire having a shape that is appropriate for the application of the micro wire can be provided, and thus the micro wire can be used for various devices.

In addition, according to the method for manufacturing the sensor of another exemplary embodiment, the above advantages are achieved when the micro wire of the sensor is formed. Also, in the exemplary embodiment, the micro wire of the sensor is connected to the first electrode and the second electrode. Therefore, the conventional processes in which the micro wire is separately formed and connected to the electrodes can be omitted. Accordingly, the manufacturing process can be simplified, and the production efficiency can be improved.

The shape and the location of the micro wire of the sensor can be adjusted considering the applications. Thus, the sensor has excellent characteristics and is applicable to various devices.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a micro wire, the method comprising:
   (a) providing an electrode assembly comprising a substrate, and a first electrode and a second electrode formed on the substrate, the first electrode and the second electrode forming a space therebetween having a first width and a second width that is smaller than the first width;
   (b) providing a solution for forming a micro wire to the space, and
   (c) applying a three-dimensional electric field to the solution to form a micro wire;
   wherein:
      the three-dimensional electric field is applied to the solution by applying a voltage to the first electrode and the second electrode,
      the solution comprises a solvent, a monomer of a conductive polymer, a catalyst comprising carbon nanotubes, and a dispersing agent, and is formed by mixing the catalyst and the dispersing agent with the solvent, and adding the monomer of the conductive polymer to the solvent mixed with the catalyst and the dispersing agent, and
      a weight ratio of the catalyst to the monomer of the conductive polymer in the solution ranges from about 0.0005 to about 0.0015.

2. The method of claim 1, wherein the substrate is a silicon substrate.

3. The method of claim 1, wherein the three-dimensional electric field is generated by applying an AC voltage to the first and second electrodes.

4. The method of claim 3, wherein the AC voltage has a frequency of 10 kHz to 10 MHz.

5. The method of claim 1, wherein, in providing of the solution to the space, the solution is dripped to the space or the electrode assembly is immersed in the solution.

6. The method of claim 1, wherein the micro wire comprises a conductive polymer.

7. The method of claim 1, wherein the monomer of the conductive polymer comprises one or more materials selected from a group consisting of pyrrole, aniline, acetylene, thiophene, isothiophene, phenylene, toluidine, azine, acene, azulene, pyridine, and indole.

8. The method of claim 1, wherein the micro wire has a diameter of a few nanometers to several hundred micrometers.

9. The method of claim 1, wherein a width of the space gradually decreases toward the inside of the substrate.

10. The method of claim 1, wherein each of the first electrode and the second electrode comprises an opposing portion, the opposing portion of the first electrode and the opposing portion of the second electrode face each other while forming the space therebetween, and
   at least one of the opposing portions of the first electrode and the second electrode has a quadrangular shape.

11. The method of claim 1, wherein each of the first electrode and the second electrode comprises an opposing portion, the opposing portion of the first electrode and the opposing portion of the second electrode face each other while forming the space therebetween, and
   at least one of the opposing portions of the first electrode and the second electrode has a width that gradually decreases toward the other opposing portion.

12. The method of claim 1, wherein the providing of the electrode assembly comprises providing the substrate, forming a groove on the substrate, and forming the first and second electrodes, and
   the first electrode is formed on at least a first surface of the groove, and the second electrode is formed on at least a second surface of the groove facing the first surface.

13. The method of claim 1, wherein the providing of the electrode assembly comprises providing the substrate, forming a first oxidation layer on the substrate, forming a groove on the substrate and the first oxidation layer, removing the first oxidation layer, forming a second oxidation layer on the substrate, and forming the first and second electrodes on the second oxidation layer, and
   the first electrode is formed at at least a portion corresponding to a first surface of the groove, and the second electrode is formed at at least a portion corresponding to a second surface of the groove facing the first surface.

14. The method of claim 13, further comprising:
   forming a pattern layer on the second oxidation layer before forming the first and second electrodes on the second oxidation layer.

15. A method for manufacturing a sensor, the method comprising:
   (a) providing an electrode assembly including a substrate and a first electrode and a second electrode formed on the substrate, the first electrode and the second electrode interposing a space therebetween, the space having a first width and a second width that is smaller than the first width;
   (b) providing a solution for forming a micro wire to the space; and
   (c) applying a three-dimensional electric field to the solution to form a micro wire connected to the first electrode and the second electrode,
   wherein;
      the solution comprises a solvent, a monomer of a conductive polymer, a catalyst comprising carbon nanotubes, and a dispersing agent and is formed by mixing the catalyst and the dispersing agent with the solvent, and adding the monomer of the conductive polymer to the solvent mixed with the catalyst and the dispersing agent, and a weight ratio of the catalyst to the monomer of the conductive polymer in the solution ranges from about 0.0005 to about 0.0015.

16. The method of claim 15, wherein the substrate is a silicon substrate.

17. The method of claim 15, wherein the three-dimensional electric field is generated by applying an AC voltage to the first and second electrodes.

18. The method of claim 17, wherein the AC voltage has frequency of 10 kHz to 10 MHz.

19. The method of claim 15, wherein, in the providing of the solution to the space, the solution is dripped to the space or the electrode assembly is immersed in the solution.

20. The method of claim 15, wherein the micro wire comprises a conductive polymer.

21. The method of claim 15, wherein the monomer of the conductive polymer comprises one or more materials selected from a group consisting of pyrrole, aniline, acetylene, thiophene, isothiophene, phenylene, toluidine, azine, acene, azulene, pyridine, and indole.

22. The method of claim 15, wherein the micro wire has a diameter of a few nanometers to several hundred micrometers.

23. The method of claim 15, wherein a width of the space gradually decreases toward the inside the substrate.

24. The method of claim 15, wherein each of the first electrode and the second electrode comprises an opposing portion, the opposing portion of the first electrode and the opposing portion of the second electrode face each other while forming the space therebetween, and at least one of the opposing portions of the first electrode and the second electrode has a quadrangular shape.

25. The method of claim 15, wherein each of the first electrode and the second electrode comprises an opposing portion, the opposing portion of the first electrode and the opposing portion of the second electrode face each other while forming the space therebetween, and at least one of the opposing portions of the first electrode and the second electrode has a width that gradually decreases toward the other opposing portion.

26. The method of claim 15, wherein the providing of the electrode assembly comprises providing the substrate, forming a groove on the substrate, and forming the first and second electrodes, and the first electrode is formed on at least a first surface of the groove, and the second electrode is formed on at least a second surface of the groove facing the first surface.

27. The method of claim 15, wherein the providing of the electrode assembly comprises providing the substrate, forming a first oxidation layer formed on the substrate, forming a groove on the substrate and the first oxidation layer, removing the first oxidation layer, forming a second oxidation layer on the substrate, and forming the first and second electrodes on the second oxidation layer, and the first electrode is formed at least a portion corresponding to a first surface of the groove, and the second electrode is formed at least a portion corresponding to a second surface of the groove facing the first surface.

28. A sensor comprising:

a substrate having a groove;

a first electrode and a second electrode formed on the substrate, the first electrode and the second electrode forming a space therebetween, the space having a first width and a second width that is smaller than the first width;

a micro wire electrically connected to the first electrode and the second electrode and comprising a catalyst and a conductive polymer;

an oxidation layer disposed between the substrate and the first electrode and the second electrode;

wherein:

a weight ratio of the catalyst to a monomer of the conductive polymer in a solution for forming the micro wire ranges from about 0.0005 to about 0.0015, the solution comprises a solvent, a monomer of the conductive polymer, a catalyst, and a dispersing agent, and the catalyst comprises carbon nanotubes (CNT).

29. The sensor of claim 28, wherein the groove has a notch shape in cross-section.

30. The sensor of claim 28, wherein the substrate is a silicon substrate.

31. The sensor of claim 28, wherein the micro wire comprises a conductive polymer.

32. The sensor of claim 28, wherein the micro wire has a diameter of a few nanometers to several hundred micrometers.

33. The sensor of claim 28, wherein each of the first electrode and the second electrode comprises an opposing portion, the opposing portion of the first electrode and the opposing portion of the second electrode facing each other while interposing the space therebetween, and at least one of the opposing portions of the first electrode and the second electrode has a quadrangular shape.

34. The sensor of claim 28, wherein each of the first electrode and the second electrode comprises an opposing portion, the opposing portion of the first electrode and the opposing portion of the second electrode facing each other while interposing the space therebetween, and at least one of the opposing portions of the first electrode and the second electrode has a width that gradually decreases toward the other opposing portion.

35. The sensor of claim 28, further comprising:

an oxidation layer between the substrate and the first and second electrodes.

* * * * *